(12) United States Patent
Nakamura et al.

(10) Patent No.: US 8,749,068 B2
(45) Date of Patent: Jun. 10, 2014

(54) MOUNTING METHOD AND MOUNTING DEVICE

(75) Inventors: Michikazu Nakamura, Nirasaki (JP); Masahiko Sugiyama, Nirasaki (JP); Dai Shinozaki, Nirasaki (JP); Naoki Akiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 178 days.

(21) Appl. No.: 13/519,243

(22) PCT Filed: Dec. 24, 2010

(86) PCT No.: PCT/JP2010/073351
§ 371 (c)(1),
(2), (4) Date: Jun. 26, 2012

(87) PCT Pub. No.: WO2011/081093
PCT Pub. Date: Jul. 7, 2011

(65) Prior Publication Data
US 2012/0292775 A1    Nov. 22, 2012

(30) Foreign Application Priority Data
Dec. 28, 2009    (JP) .................................. 2009-297626

(51) Int. Cl.
*H01L 23/48*    (2006.01)

(52) U.S. Cl.
USPC .................................. 257/773; 257/E23.001

(58) Field of Classification Search
USPC .......................................... 257/773, E23.001
See application file for complete search history.

(56) References Cited

FOREIGN PATENT DOCUMENTS

| JP | 60 227428 | 11/1985 |
|---|---|---|
| JP | 62 186591 | 8/1987 |
| JP | 7 176552 | 7/1995 |
| JP | 2002 290098 | 10/2002 |
| JP | 2007 311653 | 11/2007 |

OTHER PUBLICATIONS

International Search Report Issued Apr. 5, 2011 in PCT/JP10/73351 Filed Dec. 24, 2010.

*Primary Examiner* — Anthony Ho
(74) *Attorney, Agent, or Firm* — Oblon, Spivak, McClelland, Maier & Neustadt, L.L.P.

(57) ABSTRACT

A mounting method of sequentially mounting elements on a substrate includes a mounting process of mounting one element, which is taken out by a take-out part from an accommodating part in which the elements are accommodated, on a first contact region of the surface of the substrate where a liquid is coated. The method further includes a coating process of coating a liquid, by a coating part movably provided together with the take-out part, on a contact region of the surface of the substrate different from the first contact region when the one element is mounted on the first region.

16 Claims, 16 Drawing Sheets

FIG. 7A
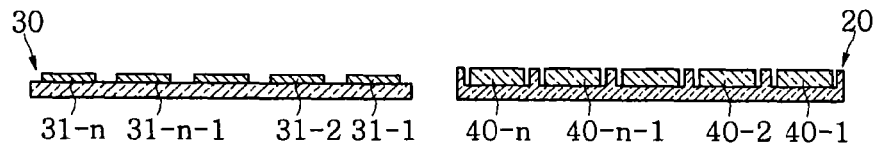
FIG. 7B
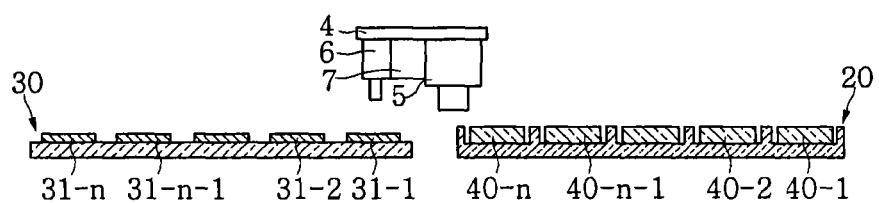
FIG. 7C1
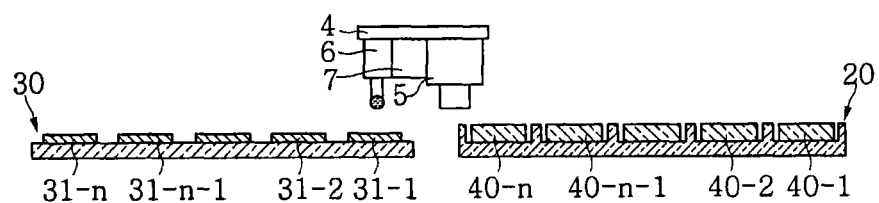
FIG. 7C2
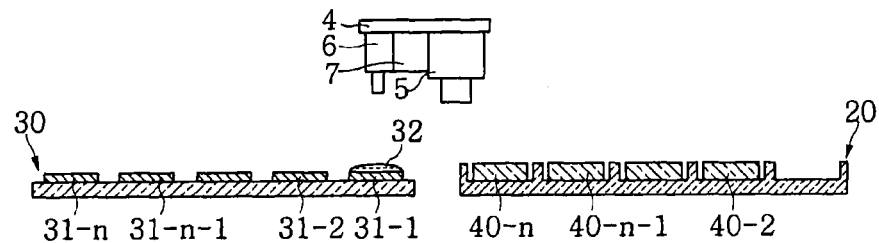
FIG. 7D
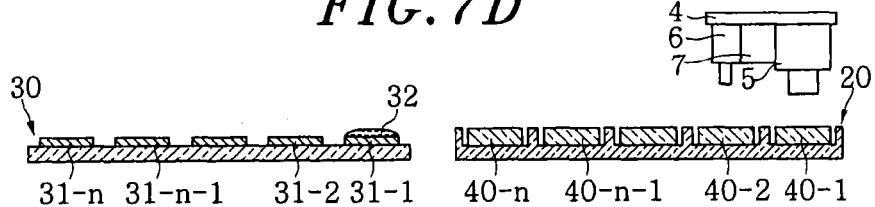

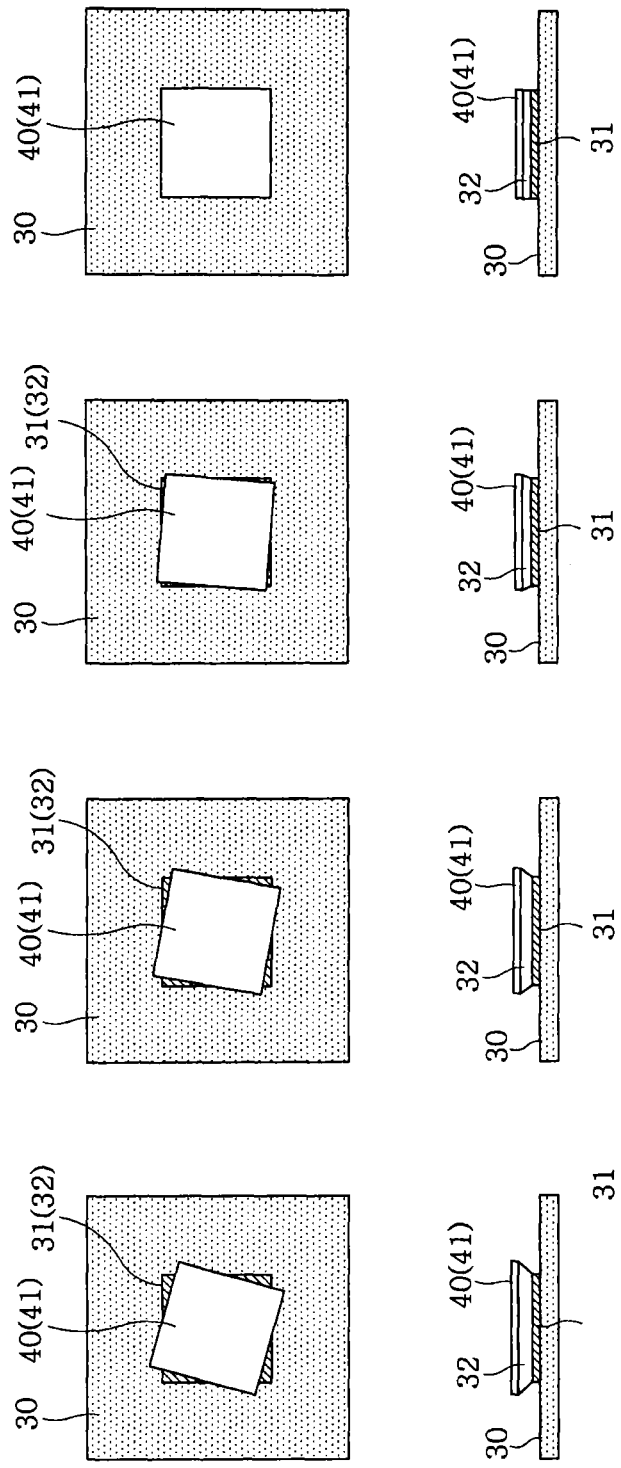

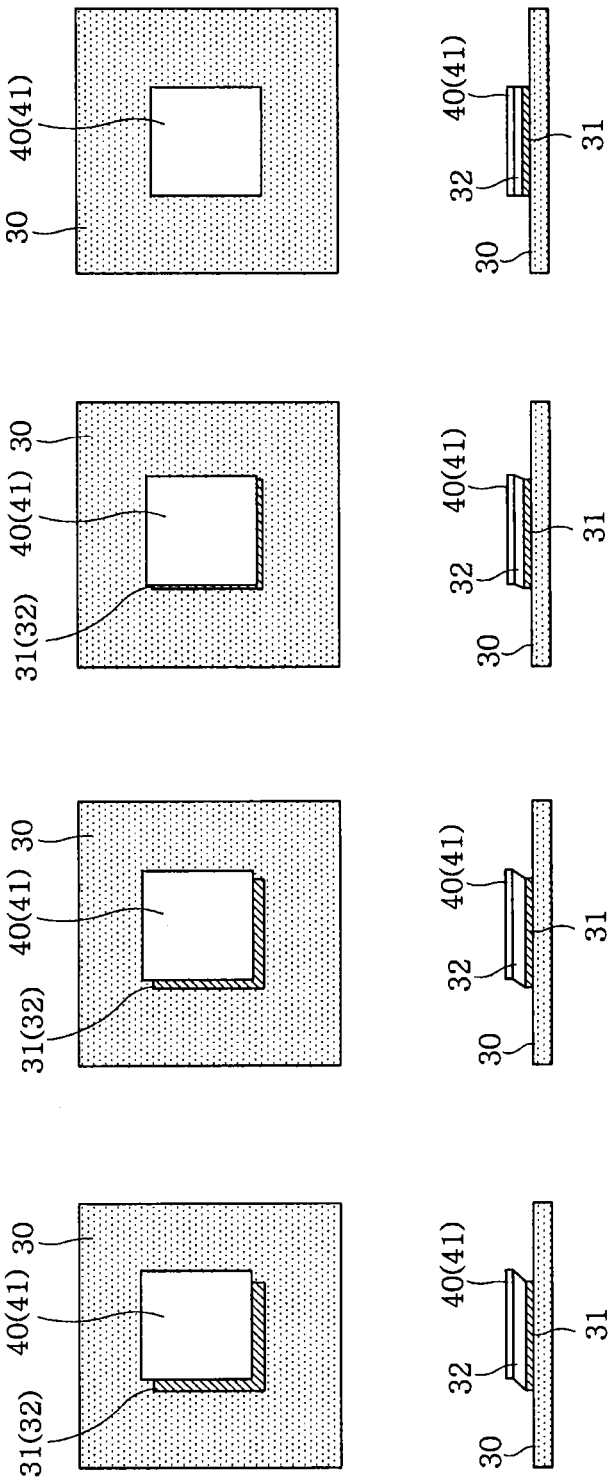

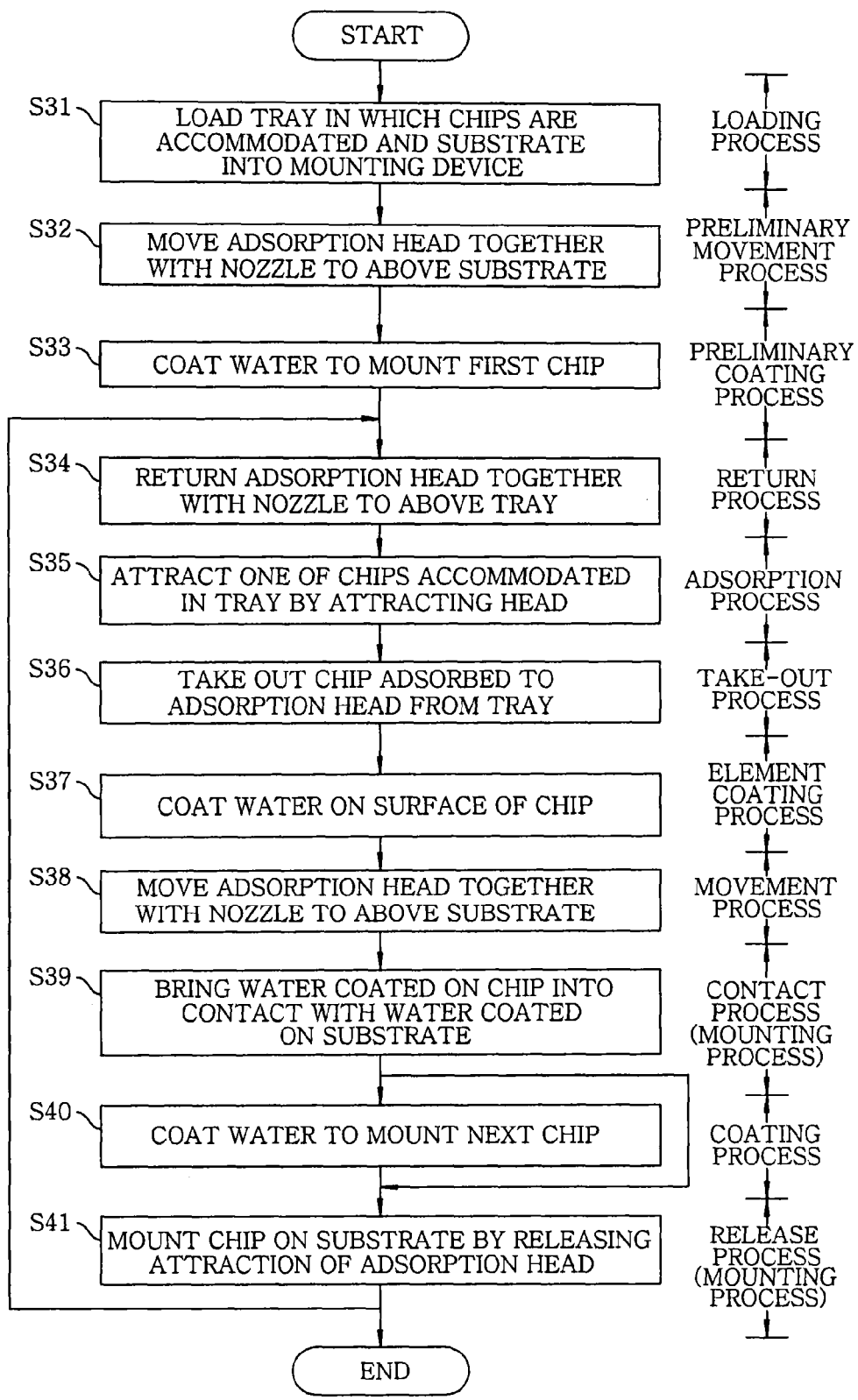

MOUNTING METHOD AND MOUNTING DEVICE

FIELD OF THE INVENTION

The present invention relates to a mounting method and a mounting device for mounting an element on a substrate.

BACKGROUND OF THE INVENTION

Recently, a three-dimensional (3D) mounting technique draws attention as semiconductor integration technology. According to the 3D mounting technique, a substrate with an integrated circuit formed thereon in advance is separated into individual pieces called dies, and known good dies (KGDs), which are determined to be good through a quality test conducted before the separation process, are selected from the dies. Then, the selected dies are deposited and mounted on a selected substrate.

For example, a method of mounting dies (hereinafter, referred to as "chips" or "elements") on a substrate, there are a method of mounting chips on a substrate collectively and a method of sequentially mounting chips on a substrate.

Among these methods, an electronic component attaching device is disclosed in, e.g., Japanese Patent Application Publication No. S62-186591 (JP62-186591A) as a mounting device of sequentially mounting chips on a substrate. The electronic components attaching device includes a tray for accommodating chips; an adsorption head adsorbing and holding the chips; and a nozzle for ejecting an adhesive onto a substrate to attach the chips to the substrate.

The electronic component attaching device adsorbs and takes out one chip from the tray by the adsorption head using a vacuum suction force, and moves the adsorption head to above the substrate while the chip is adsorbed to the adsorption head. Then, the adhesive is ejected through the nozzle and coated on a position on the substrate where the chip is to be mounted before the chip is mounted on the substrate. Subsequently, the adsorption head to which the chip is adsorbed is moved down, and the chip is mounted on the position on the substrate where the adhesive is coated.

However, such a method of sequentially mounting chips on a substrate involves the following problems.

In order to mount one chip, the electronic component attaching device disclosed in JP62-186591A first moves the adsorption head and the nozzle together from above the tray to above the substrate while the chip is adsorbed to the adsorption head. Subsequently, the adhesive is ejected thereto through the nozzle. Next, the chip is mounted on the position where the adhesive has been coated by releasing the adsorption of the adsorption head. After the chip is mounted, the adsorption head is moved from above the substrate to above the tray. As such, it is necessary to perform not only moving the adsorption head between the tray and the substrate but also ejecting the adhesive and mounting the chip. Since these processes are carried out whenever chips are sequentially mounted, it takes a long time to mount all of the chips on the substrate.

Further, in the method including the sequential coating of the adhesive to the positions where the chips are to be mounted, it is necessary to precisely control the position of the adsorption head adsorbing the corresponding chip with respect to the substrate.

SUMMARY OF THE INVENTION

In view of the above, the present invention provides a mounting method and a mounting device, capable of reducing the time required for mounting all chips on a substrate with a minimal number of operations of an adsorption head without having to precisely control the positions of the adsorption head adsorbing the chips when the chips are sequentially mounted on the substrate.

To solve the foregoing problems, the present invention provides embodiments as follows.

In accordance with an aspect of the present invention, there is provided a mounting method of sequentially mounting elements on a substrate, including a mounting process of mounting one element, which is taken out by a take-out part from an accommodating part in which the elements are accommodated, on a first contact region of the surface of the substrate where a liquid is coated; and a coating process of coating a liquid, by a coating part movably provided together with the take-out part, on a contact region of the surface of the substrate different from the first contact region when the one element is mounted on the first region.

In accordance with another aspect of the present invention, there is provided a mounting device for sequentially mounting elements on a substrate, including an accommodating part for accommodating the elements; a substrate supporting unit for supporting the substrate; a take-out part for taking out one element accommodated in the accommodating part and mounting the one element in a first contact region of the surface of the substrate where a liquid has been coated; a coating part, movably provided together with the take-out part, for coating a liquid on a second contact region of the surface of the substrate different from the first contact region while the first element is mounted in the first contact region; and a movement part for moving the take-out part taking out the one element and the coating part together from the mounting part side to the substrate side.

In accordance with the aspects of the present invention, it is possible to reduce the time required for mounting all chips on a substrate with a minimal number of operations of an adsorption head without having to precisely control the position of an adsorption head adsorbing the chips when the chips are sequentially mounted on a substrate.

BRIEF DESCRIPTION OF THE DRAWINGS

The objects and features of the present invention will become apparent from the following description of embodiments, given in conjunction with the accompanying drawings, in which:

FIGS. 8A to 8D are plan views and cross-sectional views showing how the state of the chip is changed from the state of brought into contact with the surface of water while being obliquely misaligned with contact regions to the state of being mounted in proper positions by self-alignment;

FIGS. 9A to 9D are plan views and cross-sectional views showing how the state of the chip is changed from the state of being in contact with the surface of water while being horizontally misaligned with the contact regions to the state of being mounted in proper positions by self-alignment;

FIG. 11 is a flowchart illustrating the processes of a mounting method in accordance with a modification of the embodiment.

DETAILED DESCRIPTION OF THE EMBODIMENTS

Embodiments of the present invention will now be described with reference to the accompanying drawings.

(Embodiment)

A mounting method and a mounting device in accordance with an embodiment of the present invention will be described with reference to FIGS. 1 to 10B.

Figure 1:
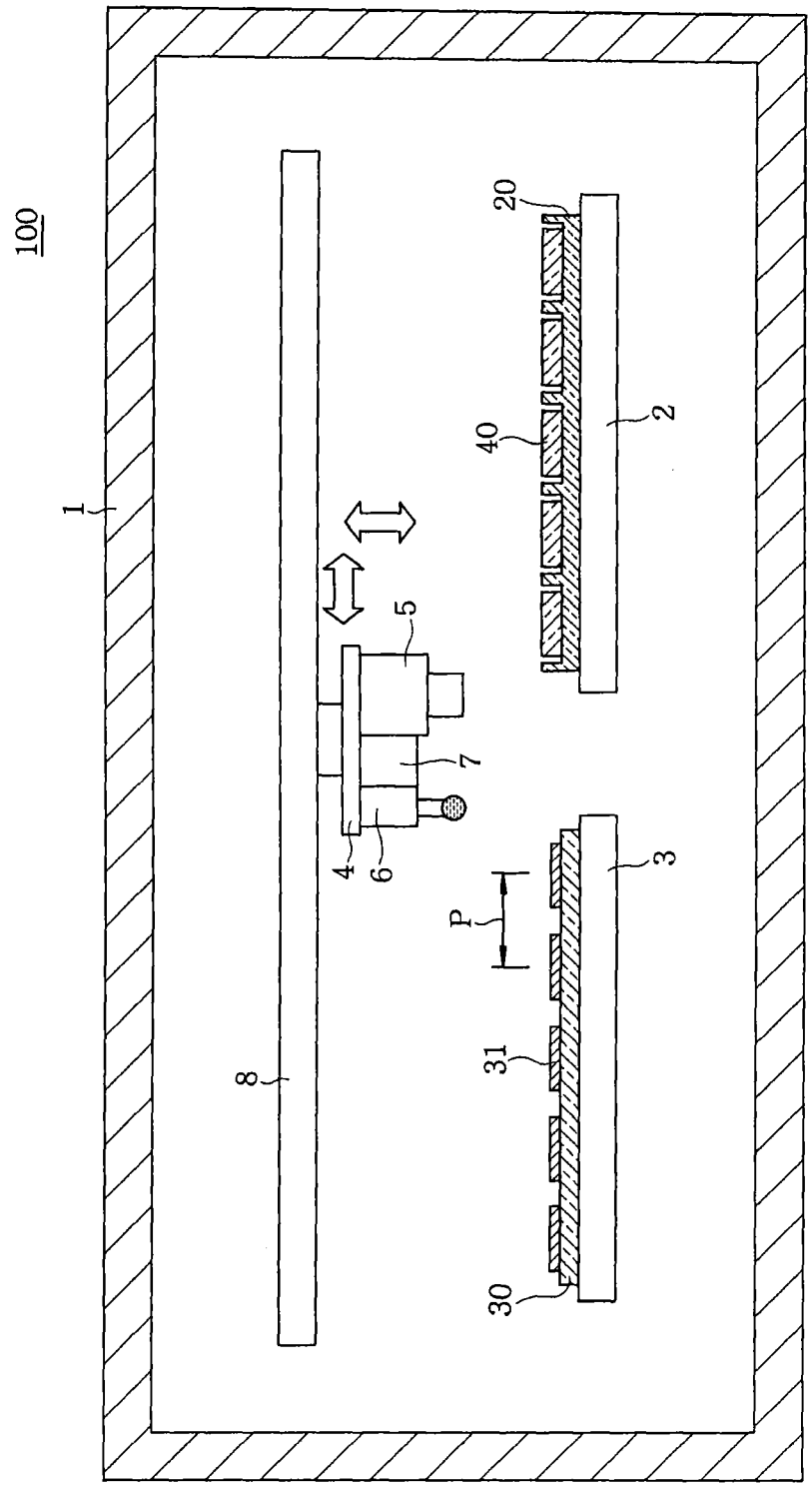
FIG. 1 is a schematic front view illustrating a configuration of a mounting device including a cross-sectional view of some components in accordance with an embodiment of the present embodiment.
Figure 2:
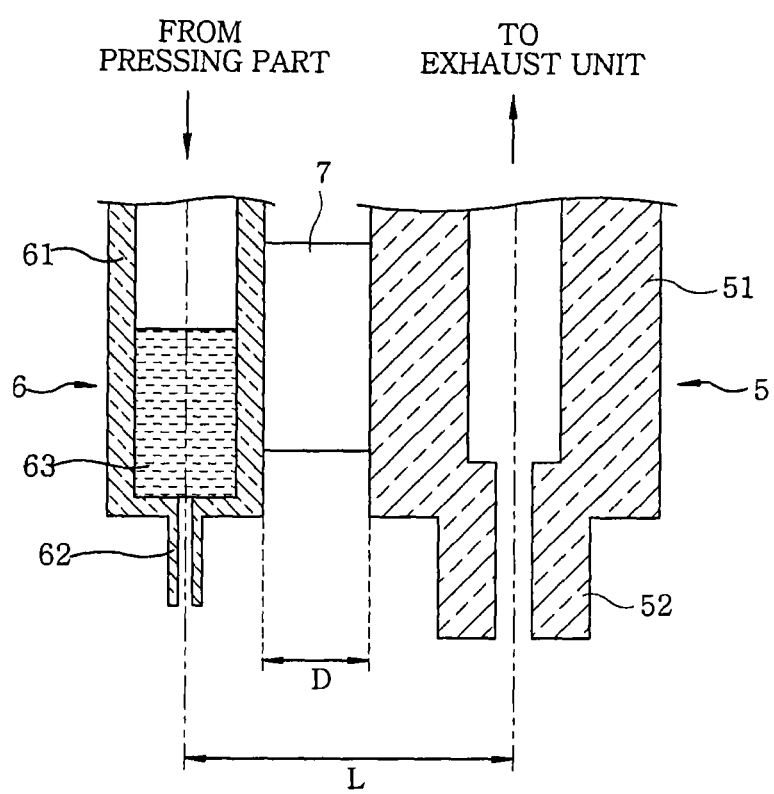
FIG. 2 is an enlarged cross-sectional view illustrating an adsorption head and a nozzle.
Figure 3A:
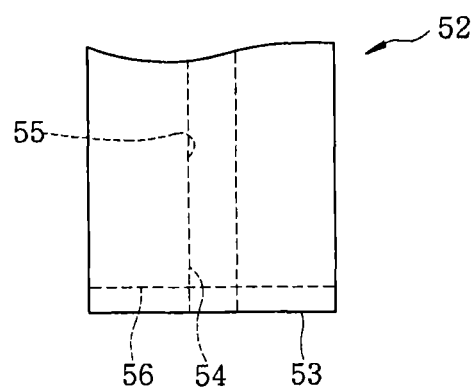
FIGS. 3A and 3B are respectively a front view and a perspective view showing an example of the shape of a head end portion of the adsorption head.
Figure 3B:
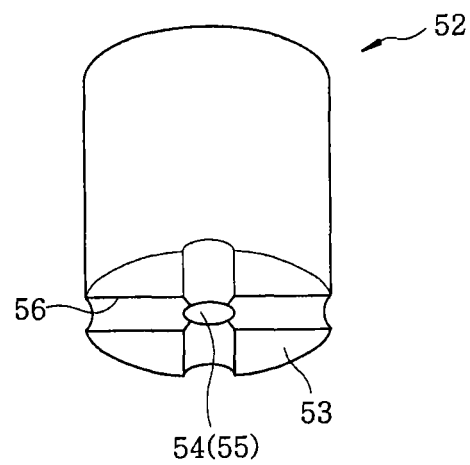
Figure 4A:
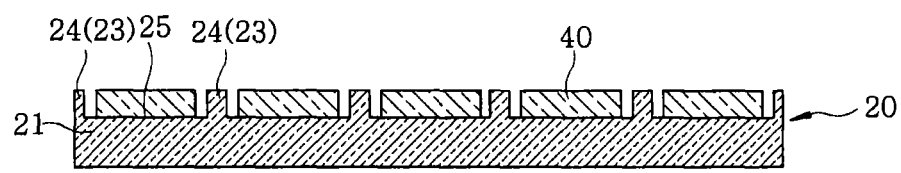
FIGS. 4A and 4B are cross-sectional views illustrating a structure of a tray.
Figure 4B:
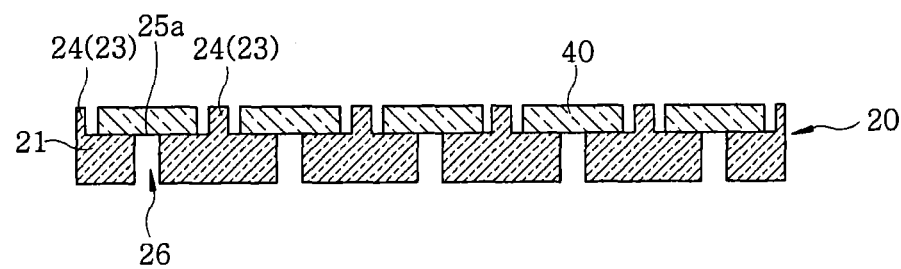

First, the mounting device will be described with reference to FIGS. 1 to 4B. FIG. 1 is a schematic front view illustrating a configuration of the mounting device including a cross-sectional view of some components. FIG. 2 is an enlarged cross-sectional view illustrating an adsorption head and a nozzle. FIGS. 3A and 3B are respectively a front view and a perspective view showing an example of the shape of a head end portion of the adsorption head. FIGS. 4A and 4B are cross-sectional views illustrating a structure of a tray, wherein FIG. 4A shows an example of the tray shown in FIG. 1, and FIG. 4B shows an example of a tray having a different structure from the tray shown in FIG. 1.

As shown in FIG. 1, the mounting device 100 includes a processing chamber 1; a tray base 2; a stage 3; a robot 4; an adsorption head 5; and a nozzle 6. Also, the mounting device 100 includes a loading/unloading port (not shown) and a carrier (not shown) for carrying a tray 20 and a substrate 30.

As shown in FIG. 1, the processing chamber 1 is provided to surround the tray base 2, the stage 3, the robot 4, the adsorption head 5, and the nozzle 6. Further, the processing chamber 1 is configured to control the internal atmosphere and pressure. The processing chamber 1 is connected to a supply unit (not shown) to introduce a gas, such as clean air or nitrogen gas having adjusted temperature and humidity, and to a pump (not shown) for exhausting the inside of the processing chamber, so that the pressure in the processing chamber 1 can be adjusted depending on the type of processing.

As shown in FIG. 1, the tray base 2 is disposed at a lower portion in the processing chamber 1. The tray 20 mounting chips 40 is fixed and supported on the tray base 2. The stage 3 is also disposed at the lower portion in the processing chamber 1 side by side with the tray base 2. The stage 30 fixes and supports the substrate 30. The tray base 2 and the stage 3 are preferably placed on the same plane if possible so that the operations of the robot 4 can be minimized.

The tray 20 serves as an accommodating part in the present invention. The stage 3 serves as a substrate supporting unit in the present invention. The chips 40 correspond to elements in the present invention.

As shown in FIG. 1, the robot 4 is provided in the processing chamber 1 to fix the adsorption head 5 and the nozzle 6. The adsorption head 5 and the nozzle 6 are fixed to the robot 4 adjacent to each other via a spacer 7 therebetween. The robot 4 can be moved by a rail member 8 installed in the processing chamber 1 in the direction of a plane (including the left and right directions in FIG. 1 and being perpendicular to the plane of the paper showing FIG. 1) and in the vertical direction in FIG. 1. The robot 4 moves the adsorption head 5 together with the nozzle 6 from above the tray 20 to above the substrate 30 supported by the stage 3. The robot 4 can be replaced by a multi-jointed arm-type robot.

The robot 4 serves as a moving part in the present invention.

As shown in FIG. 1, the adsorption head 5 is fixed to the robot 4. The adsorption head 5 serves to adsorb and hold the chips 40. Above the tray 20, the adsorption head 5 adsorbs and takes out the chips 40 mounted in the tray 20 one by one. Then, the adsorption head 5 releases the adsorption above the substrate 30 supported by the stage 3, and subsequently mounts the chips 40 on contact regions 31 on the surface of the substrate 30 where water is coated to mount the chips 40.

As shown in FIG. 2, the adsorption head 5 includes a head main body 51 and a head end portion 52. The head main body 51 is connected to an exhaust part (not shown), and the chips 50 is adsorbed and held to the head end portion 52 through the vacuum suction by exhausting the inside of the head main body 51 to vacuum by the exhaust part.

The adsorption head 5 serves as not only an adsorbing part but also a take-out part in the present invention. The adsorption head 5 may adsorb and hold the chips by any known method, e.g., electrostatic adsorption, without being limited to vacuum suction. The adsorption head may be replaced by, for example, a take-out head, which holds and takes out chips from the tray by using an arm and releases the chips on a substrate to be mounted on the substrate. The take-out head also serves as the take-out part in the present invention.

The head end portion 52 may have, e.g., a shape shown in FIGS. 3A and 3B. In FIGS. 3A and 3B, a gas exhaust hole 55 is longitudinally formed in the center of the head end portion 52 in such a way that the head end portion 52 communicates with an opening 54 formed on an end portion, i.e., a bottom surface 53 thereof. Further, grooves 56 are formed in a cross shape on the bottom surface 53 and intersect at the opening 54. The gas exhaust hole 55 is connected to the exhaust part via the head main body 51. The grooves 56 are extended to the circumferential edge of the bottom surface 53 having a nearly circular shape so as to adjust the adsorptive force of the adsorption head 5 produced by vacuum suction to thereby allow the adsorbed chips to easily drop when the adsorption is released.

As shown in FIG. 1, the nozzle 6 is fixed to the robot 4. The nozzle 6 is used to coat, for example, water on the surface of the substrate 30. In addition to water, through the nozzle 6, various liquids or gel-type materials having a low viscosity may be supplied. The present embodiment is described by taking as an example the case where water is ejected through the nozzle 6. An example of the nozzle 6 may be a dispenser.

As shown in FIG. 2, the nozzle 6 includes a nozzle main body 61 and a nozzle end portion 62. The nozzle main body 61 stores water 63 inside. The nozzle main body 61 is connected to a pressing part (not shown), which pressurizes the internal space of the nozzle main body 61, thereby ejecting water from the nozzle end portion 62.

The nozzle 6 serves as a coating part in the present invention. The nozzle 6 may be an equipment, such as a syringe and an inkjet head, for coating a liquid by using a known ejecting method or coating method without being limited to the dispenser.

As shown in FIGS. 1 and 2, the adsorption head 5 and the nozzle 6 are adjacent to each other via the spacer 7 therebetween. The spacer 7 is provided in such a way that the adsorption head 5 and the nozzle 6 are respectively disposed above two adjacent chips. In other words, the spacer 7 is provided to have such a long width (e.g., "D" in FIG. 2) as to coat water on one of two adjacent contact regions 31 of the surface of the substrate 30 when the adsorption head 5 mounts one chip in the other contact region 31 where water has been coated.

Further, the spacer 7 may have the optimal width D depending on the size of the chips 40 to be mounted and packaged on the substrate 30 and a predetermined pitch P between the contact regions 31 of the substrate 30 where the chips 40 are mounted. Accordingly, the distance L between the center of the head end portion 52 of the adsorption head 5 and the center of the nozzle end portion 62 of the nozzle 6 is set to be substantially equivalent to the pitch P. That is, the nozzle 6 is provided such that the distance L between the nozzle 6 and the adsorption head 5 is adjustable depending on the pitch P. Although the pitch P can be adjusted by employing a variable structure using a small ball screw, the spacer 7 is preferably used in terms of a simple structure.

As shown in FIG. 4A, the tray 20 includes a main body 21. Although not shown in FIG. 4A, the main body 21 has a rectangular shape when seen in a plan view. The surface of an upper wall 23 of the main body 21 is partitioned by partition walls 24 into rectangular sections, the rectangular sections serving as chip mounting regions 25 in which the chips 40 are mounted. The tray 20 is formed of quartz or transparent plastic which is manufactured with a lower cost.

Alternatively, as shown in FIG. 4B, in a tray 20a, through holes 26 may be formed between the bottoms of chip mounting regions 25a and the bottom of the tray 20a to be extended through the main body 21 so that the adsorption head 5 easily takes out the chips 40 through vacuum adsorption.

Next, the mounting method of the mounting device in accordance with the present embodiment will be described with reference to FIGS. 5 to 7R.

Figure 5:
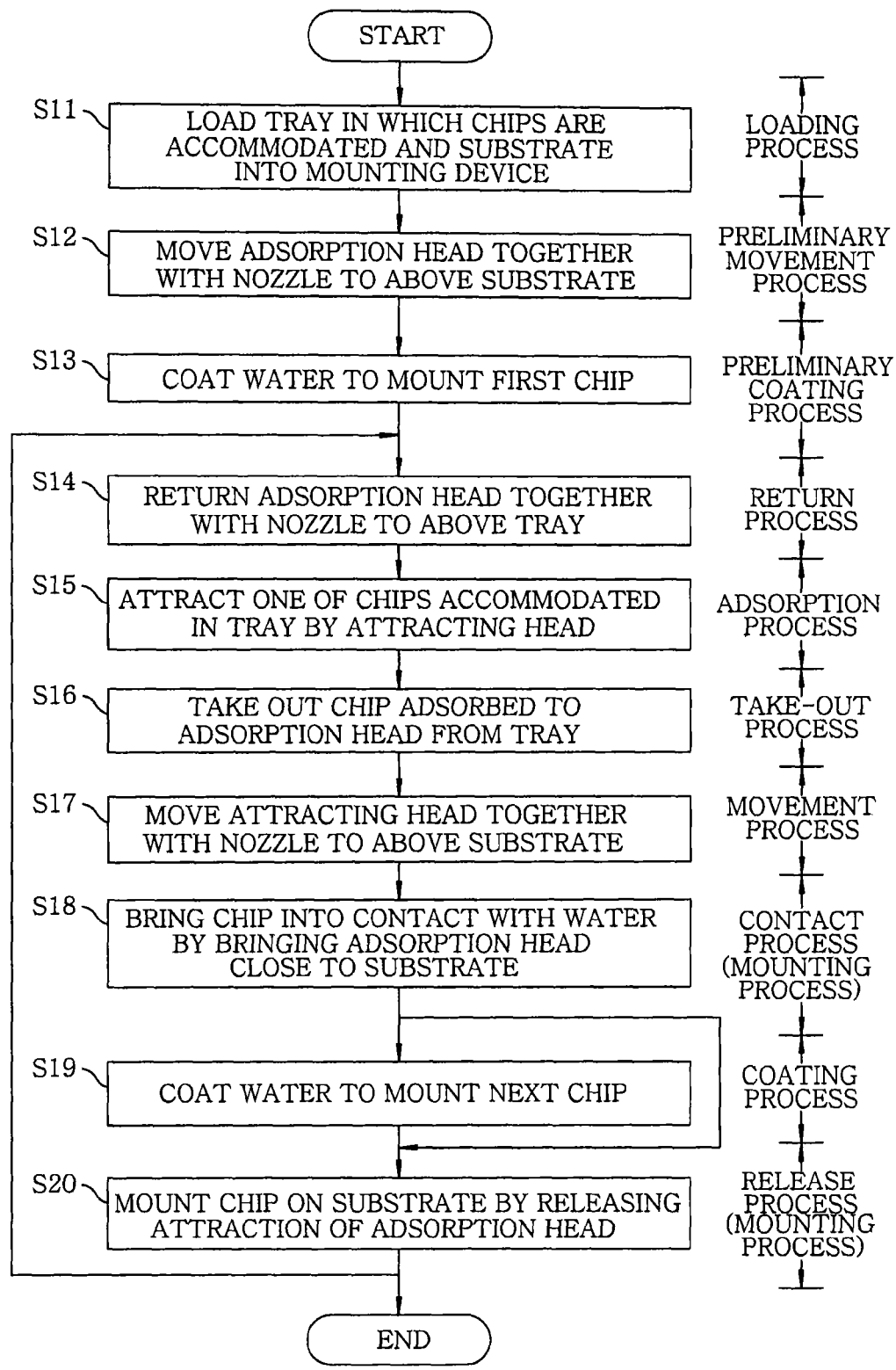
FIG. 5 is a flowchart illustrating the processes of a mounting method in accordance with the embodiment of the present invention.
Figure 6A:
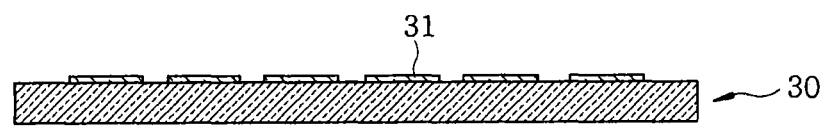
FIGS. 6A and 6B are cross-sectional views illustrating configurations of a substrate and a chip prepared in advance.
Figure 6B:
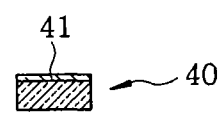
Figure 7E:
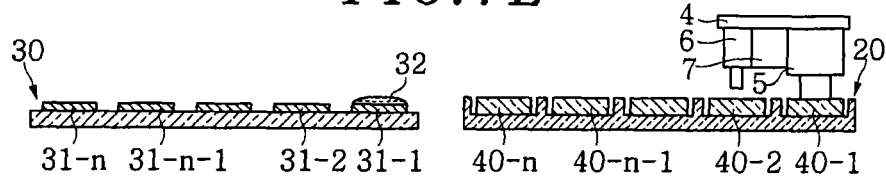
FIGS. 7A to 7R are schematic cross-sectional views illustrating the states of chips and a substrate in each process of the mounting method in accordance with the embodiment of the present invention.
Figure 7F:
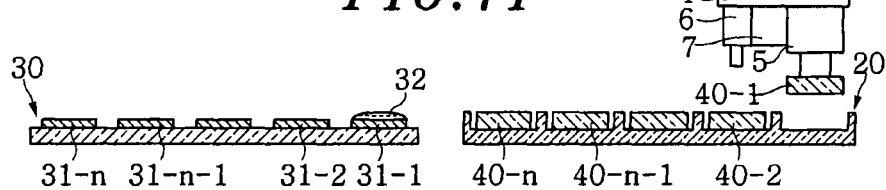
Figure 7G:
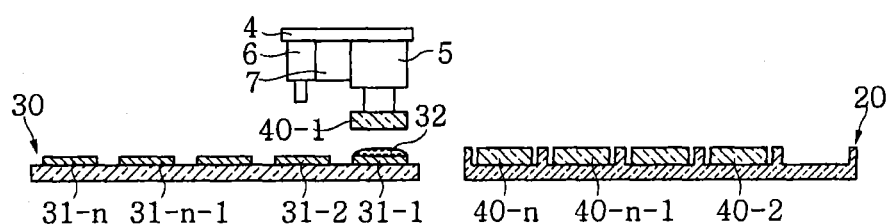
Figure 7H:
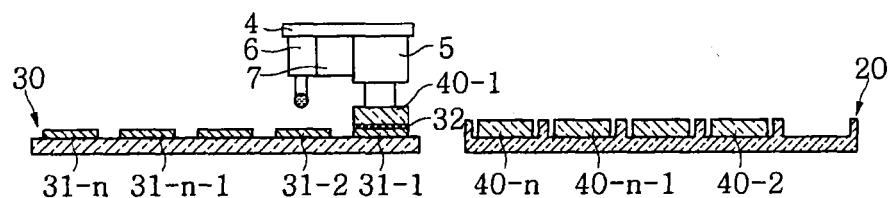
Figure 7I:
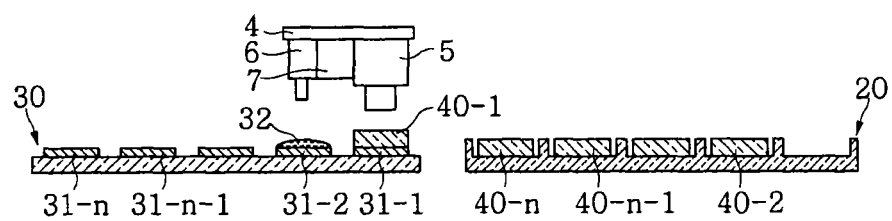
Figure 7J:
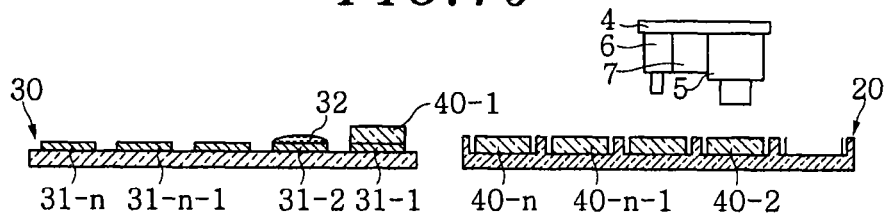
Figure 7K:
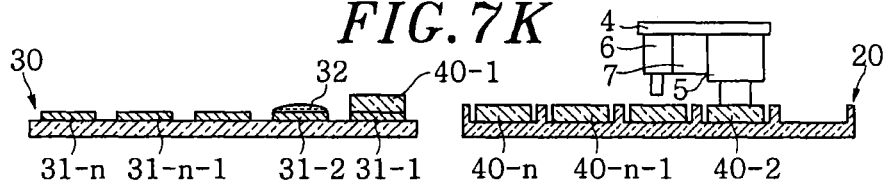
Figure 7L:
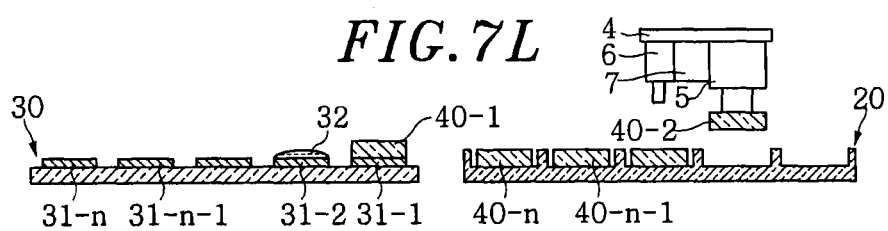
Figure 7M:
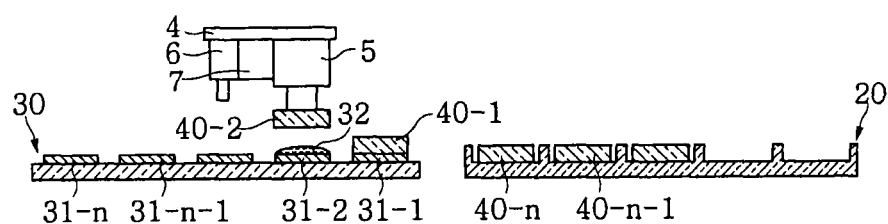
Figure 7N:
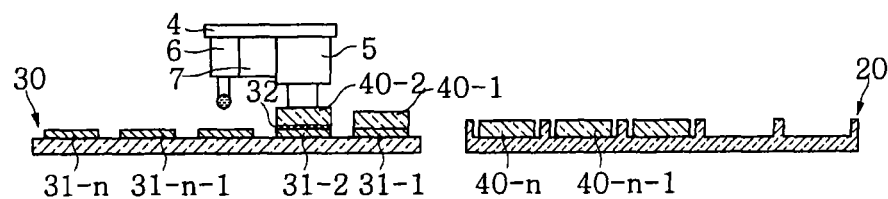
Figure 7O:
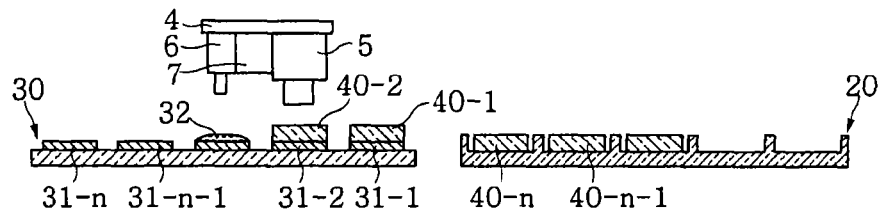
Figure 7P:
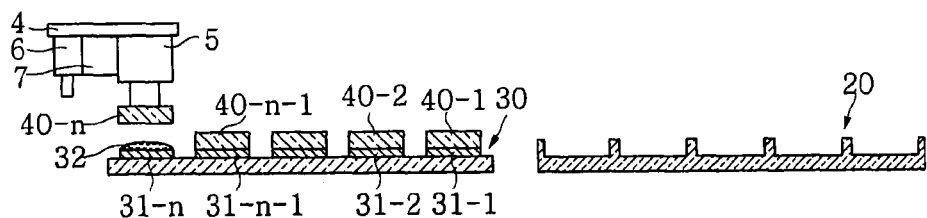
Figure 7Q:
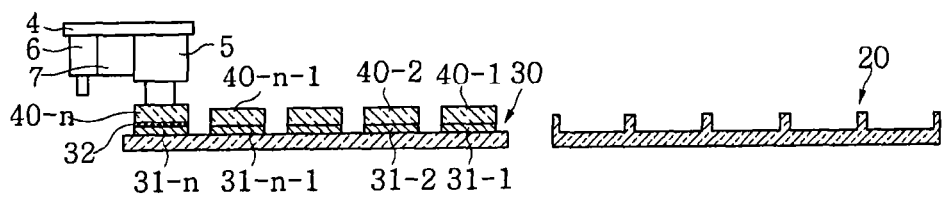
Figure 7R:
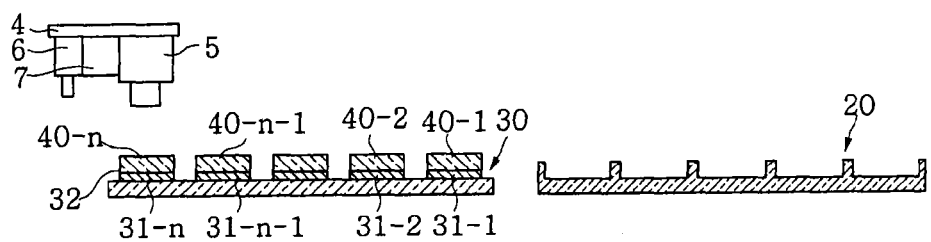

FIG. 5 is a flowchart illustrating each process of the mounting method in accordance with the present embodiment. FIGS. 6A and 6B are cross-sectional views illustrating configurations of a substrate and a chip prepared in advance. FIGS. 7A to 7R are schematic cross-sectional views illustrating the states of the chips and the substrate in each process of the mounting method.

As shown in FIG. 5, the mounting method in accordance with the present embodiment includes a loading process (step S11), a preliminary movement process (step S12), a preliminary coating process (step S13), a return process (step S14), an adsorption process (step S15), a take-out process (step S16), a movement process (step S17), a contact process (step S18), a coating process (step S19), and a release process (step S20).

In the present embodiment, there is prepared in advance a substrate 30 which has an enough size for a needed number of chips, e.g., semiconductor chips, to be mounted in a desired layout and has a hardness sufficient to endure the weight of the needed number of the chips. For example, a glass substrate and a semiconductor wafer which have a sufficient hardness may be used for the substrate 30.

As shown in FIG. 6A, contact regions 31 where the chips 40 are to be mounted are formed on the surface of the substrate 30. The size and shape of the contact regions 31 are substantially the same as those of the chips 50 to be mounted thereon.

In the present embodiment, since water is used as an alignment liquid for aligning the chips 40, the contact regions 31 are prepared to have hydrophilicity. Such contact regions 31 can be easily formed, for example, by using a silicon dioxide ($SiO_2$) film having hydrophilicity. That is, a $SiO_2$ film (e.g., 0.1 μm in thickness) is formed thin on the entire mounting surface of the substrate 30 by using a known method and then selectively removed by a known etching method, thereby readily obtaining the contact regions 31. With the hydrophilicity of the contact regions 31, if a small amount of water is loaded onto the contact regions 31, the water becomes accustomed to the entire surface of each of the contact regions 31 (i.e., the water wets the entire surface of each of the contact regions 31), thereby forming a thin water layer (water drops) 32 covering the entire surface. The contact regions 31 have an island shape and thus are isolated from each other, so that the water is not discharged out of the contact regions 31.

Available materials for the hydrophilic contact regions 31 may include $Si_3N_4$, a double layer of aluminum and alumina ($Al/Al_2O_3$) and a double layer of tantalum and tantalum oxide ($Ta/Ta_2O_5$) in addition to $SiO_2$.

In order to securely prevent the water from spilling out of the contact regions 31 and stagnating, the other region of the substrate 30 than the contact regions 31 on which the chips 40 are to be mounted preferably has hydrophobicity. For example, the substrate 30 itself is preferably formed of monocrystalline silicon (Si), fluorine resin, silicone resin, Teflon (Trademark) resin, polyimide resin, resist, wax, benzocyclobutene (BCB), and the like, which are hydrophobic. Alternatively, the mounting surface of the substrate 30 on which the contact regions 31 are formed is preferably covered with polycrystalline silicon, amorphous silicon, fluorine resin, silicone resin, Teflon resin, polyimide resin, resist, wax, BCB, and the like.

Instead, selective hydrophilization may be applied to the contact regions 31 by using an ink jet method or the like.

Also, in the mounting method in accordance with the present embodiment, the surfaces of the chips are hydrophilized in advance.

As shown in FIG. 6B, a joint portion 41 having hydrophilicity is formed on one surface of each chip 40. The joint portion 41 is easily formed, for example, by covering the entire portion of the corresponding surface of each chip 40 with a $SiO_2$ film having hydrophilicity. Further, a connecting member may be formed on the opposite surface of each of the chips 40 to the surface thereof where the joint portion 41 is formed, wherein the connecting member is used for electrically connecting the corresponding chip 40 to a substrate when the chip 40 is transferred (mounted and moved) from the substrate 30 to another substrate.

In the present embodiment, the substrate 30 may be a semiconductor wafer having a diameter of, e.g., 300 mm. The chips 40 may be square semiconductor chips, each side of which has a length of, e.g., 5 mm, obtained by dicing a semiconductor wafer with a diameter of, e.g., 300 mm. Further, a through electrode with a diameter of, e.g., 5 nm may be formed in the joint portions 41 of the chips 40 and the contact regions 31 of the substrate 30.

After the hydrophilized substrate 30 and the chips 40 are prepared as above, the loading process is carried out in step S11. In step S11, the tray 20 and the substrate are loaded into the mounting device 100, the chips 40 being accommodated in the tray 20. FIG. 7A shows the state of the chips and the substrate in step S11. As shown in FIG. 7A, the tray 20 and the substrate 30 on which the chips 40 are to be mounted and packaged are loaded into the processing chamber 1 of the mounting device 100. The substrate 30 is fixed to and held on the stage 3, as shown in FIG. 1. In FIGS. 7A to 7R, the illustration of the processing chamber 1, the tray base 2, and the stage 3 is omitted.

Next, the preliminary movement process is carried out in step S12. In step S12, the adsorption head 5 is moved together with the nozzle 6 to above the substrate 30. FIG. 7AB shows the state of the chips and the substrate in step S12. As shown in FIG. 7AB, the adsorption head 5 is moved together with the nozzle 6 by the robot 4 to above a contact region 31-1 on the surface of the substrate 30 where a first chip 40-1 is to be mounted. The contact regions 31-1 to 31-n are collectively referred to as the contact regions 31.

Next, the preliminary coating process is carried out in step S13. In step S13, water is coated to mount the first chip 40-1. FIGS. 7C1 and 7C2 show the state of the chips and the substrate in step S13. As shown in FIG. 7C1, through the nozzle 6, water is ejected to the contact region 31-1 on the surface of the substrate 30 where the first chip is to be mounted.

Here, the contact regions 31 are hydrophilized in advance. Thus, the water ejected through the nozzle 6 spreads to the entire surface of each of the hydrophilized contact regions as shown in FIG. 7C2, and accordingly the thin water layer 32 is formed in such a way to cover the entire surface of the corresponding contact region 31. The water layer 32 curves naturally in a gentle convex form by surface tension. The amount of water is preferably adjusted, for example, to the extent enough to form the water layers 32 on the contact regions 31 as shown in FIG. 7C2.

The water used in the present embodiment is preferably ultrapure water generally used in a conventional semiconductor manufacture process. More preferably, ultrapure water containing an appropriate additive for increasing the surface tension of water is used to reinforce a self-aligning function of the chips 40 with the contact regions 31 of the substrate 30. As the self-aligning function is reinforced, the positional accuracy of the chips 40 with respect to the contact regions 31 of the substrate 30 is improved. Also, as described above, silicon dioxide ($SiO_2$) can be preferably used as a hydrophilic material.

Instead of water, an inorganic or organic liquid may be used. For example, glycerin, acetone, alcohol, a spin on glass (SOG) material, or the like are preferably used. In addition, adhesives having adequate viscosity and reducing liquids, such as formic acid, can be used. In this case, lyophilic materials for such liquids are necessary to form the contact regions 31, and examples of such materials include silicon nitride ($Si_3N_4$), various kinds of metal, thiol, alkanethiol, and the like.

Next, the return process is carried out in step S14. In step S14, the adsorption head 5 is returned together with the nozzle 6 to above the tray 20. FIG. 7D shows the state of the chips and the substrate in step S14. As shown in FIG. 7D, after water is ejected, the robot 4 returns the adsorption head 5 together with the nozzle 6 to above the tray 20 in such a way that the adsorption head 5 is disposed above the first chip 40-1 that is to be taken out from the tray 20. The chips 40-1 to 40-n are collectively referred to as the chips 40.

Next, the adsorption process is carried out on the first chip 40-1 in step S15. In step S15, one of the chips 40 accommodated in the tray 20 is adsorbed by the adsorption head 5. FIG. 7E shows the state of the chips and the substrate in step S15. As shown in FIG. 7E, the adsorption head 5 is moved down by the robot 4 in such a way as not to destroy the chips 40 and the tray 20 and as to come in contact with the first chip 40-1. Then, the chip 40-1 is adsorbed by the adsorption head 5.

To control whether the adsorption head 5 comes in contact with the chips 40, a calculator may be provided to detect the relative position of the adsorption head 5 to the tray 20 in advance. Alternatively, a pressure detector may be provided in the adsorption head 5 to detect the pressure applied when the adsorption head 5 comes in contact with the chips 40. Further alternatively, an optical distance measuring unit may be provided in the robot 4 and/or the adsorption head 5.

Next, the take-out process is carried out on the first chip 40-1 in step S16. In step S16, the chip 40-1 adsorbed to the adsorption head 5 is taken out from the tray 20. FIG. 7F shows the state of the chips and the substrate in step S16. After the first chip 40-1 is adsorbed and held, the adsorption head 5 is moved up by the robot 4 to a parallel moving position above the tray 20 from which the adsorption head 5 is to be moved in parallel to above the substrate 30 as shown in FIG. 7F.

Next, the movement process is carried out in step S17. In step S17, the adsorption head 5 is moved together with the nozzle 6 from above the tray 20 to above the substrate 30. FIG. 7G shows the state of the chips and the substrate in step S17. The adsorption head 5 is moved up to the parallel moving position, and then continuously moved together with the nozzle 6 until the first chip 40-1 adsorbed to the adsorption head 5 is placed above the contact region 31-1 on the surface of the substrate 30 where the first chip 40-1 is to be mounted. At this time, the position of the first chip 40-1 adsorbed by the moved adsorption head 5 may not precisely correspond with the position of the contact region 31-1. That is, it is not needed to precisely adjust the position of the adsorption head 5.

Next, the contact process in step S18 and the coating process in step S19 are carried out at the same time. In step S18, the adsorption head 5 is brought close to the substrate 30 so that the chip 40-1 comes in contact with the water layer 32. In step S19, the water layer 32 is coated to mount a next chip 40. FIG. 7H shows the state of the chips and the substrate in steps S18 and S19.

As shown in FIG. 7H, the adsorption head 5 is moved down together with the nozzle 6 by the robot 4 close to the substrate 30, about to the contact region 31-1 on the surface of the substrate 30 where the first chip 40-1 is to be mounted, so that the first chip 40-1 comes in contact with the water layer 32 coated to the contact region 31-1.

At this time, the robot 4 may preferably move the adsorption head 5 down to such a height position as to bring the chip 40-1 adsorbed to the adsorption head 5 into contact with the surface of the water layer 32 coated on the contact region 31-1. Accordingly, the adsorption head 5 may not be moved down until the chip 40 adsorbed to the adsorption head 5 reaches the contact region 31.

While the first chip 40-1 adsorbed to the adsorption head 5 comes in contact with the water coated on the contact region 31-1, water is ejected through the nozzle 6 to a contact region 31-2 where a next chip 40-2 is to be mounted, which is adjacent to the contact region 31-1.

Next, the release process is carried out in step S20 together with the above two steps. In step S20, the adsorption of the adsorption head 5 is released so that the chip 40-1 is mounted on the substrate 30. FIG. 7I shows the state of the chips and the substrate in steps S19 and S20. As shown in FIG. 7I, the adsorption of the adsorption head 5 is released to separate the first chip 40-1 from the adsorption head 5. The first chip 40-1 separated from the adsorption head 5 is adsorbed to the contact region 31-1 on the surface of the substrate 30 where the first chip 40-1 is to be mounted by the surface tension of the water layer 32. Here, the water layer 32 is gradually evaporated away and thus is not shown in FIG. 7I. Even after the water layer 32 disappears by evaporation, the chip 40-1 is kept adsorbed to the corresponding contact region 31-1 on the surface of the substrate 30.

At this time, if the chips 40 are prepared to have the same size as that of the contact regions 31, they are self-aligned to the desired contact regions 31 by the surface tension of water, which will be described. That is, in the present embodiment, it is not necessary to precisely adjust the position of the robot 4 to align the respective chips 40 with the substrate 30. Thus, after the chips 40 are sequentially mounted on the substrate 30 by releasing the adsorption of the adsorption head 5, the adsorption head 5 and the nozzle 6 are quickly moved by the robot 4 to above the tray 20, thus saving the time required for mounting the chips 40 on the substrate 30.

Step S19 may be carried out between step S17 and a subsequent process to step S20, before step S18 not simultaneously with step S18, simultaneously with step S20, or immediately after step S20. That is, water may be coated on the contact region 31-2 where the next chip 40-2 is to be mounted while the first chip 40-1 is mounted in the contact region 31-1 by releasing the adsorption of the adsorption head 5.

Alternatively, instead of steps S18 and S20, the chip 40 adsorbed to the adsorption head 5 is brought close to such a position (e.g., about 0.5 mm above from the surface of the substrate 30) above the surface of the water layer 32 coated on the contact region 31 as not to come in contact with the water layer 32, and then the adsorption of the adsorption head 5 is released so that the chip 40 drops to the surface of the water layer 32 coated on the contact region 31. In this case, step S18 may be replaced by a step of merely bring the adsorption head 5 close to the substrate 30.

As described above, through the respective processes shown in FIGS. 7D to 7I, the first chip 40-1 is mounted by the adsorption head 5 from the tray 20 to the region (first contact region) 31-1 on the surface of the substrate 30 where the water layer 32 has been coated to mount the first chip 40-1. Also, while the first chip 40-1 is mounted by the adsorption head 5 in the first contact region 31-1, the water layer 32 is coated by the nozzle 6 to the contact region 31-2 adjacent to the first contact region 31-1 in order to mount the second chip 40-2.

After the respective processes of steps S14 to S20 are carried out for the first chip 40-1, steps S14 to S20 are repeated for the next chip 40-2, thereby mounting the chip 40-2 from the tray 20 to the substrate 30. FIGS. 7J to 7O show the state of the chips and the substrate in the respective processes of steps S14 to S20 for the next chip. FIGS. 7J to 7O are substantially the same as FIGS. 7D to 7I except that a subsequent chip is mounted instead of the first chip. The description of the steps is the same as above and thus is omitted herein.

As such, through the processes shown in FIGS. 7C to 7O, the second chip 40-2 is mounted by the adsorption head 5 from the tray 20 to the region (second contact region) 31-2 where the water layer 32 has been coated to mount the second chip 40-2, which is adjacent to the first contact region 31-1. Further, while the second chip 40-2 is mounted by the adsorption head 5 in the second contact region 31-2, the water layer 32 is coated by the nozzle 6 to a region (where a third chip is to be mounted) adjacent to the second contact region 31-2 in order to mount a next chip 40.

To mount the first chip 40-1 to the final chip 40-n in one row, the foregoing processes are repeated in the same manner until the $(n-1)^{th}$ chip 40-n-1.

However, the final chip 40-n in the row involves a different process after steps S14 to S17. As shown in FIG. 5, when the final chip ($n^{th}$ chip) 40-n is mounted, steps S18 and S20 are carried out except for step S19. FIGS. 7P to 7R show the state of the final chip ($n^{th}$ chip) and the substrate in steps S17, S18, and S20, respectively. As shown in FIGS. 7P to 7R, while the final chip ($n^{th}$ chip) 40-n is mounted by the adsorption head 5 in the final region ($n^{th}$ contact region) 31-n, water may not be coated by the nozzle 6 to mount a next chip.

In this manner, the first chip 40-1 to the final chip ($n^{th}$ chip) 40-n to be arranged in one row are sequentially mounted on the substrate 30 at a predetermined pitch P. Then, a series of such processes is repeated a plurality of times (m times), thereby sequentially mounting the chips 40 on the substrate 30 to be arranged at the predetermined pitch P horizontally in an m×n matrix form.

After all of the chips 40 are completely mounted in this way, the substrate 30 equipped with all of the chips 40 is taken out of the processing chamber 1. Alternatively, the substrate 30 may be heated by a heater (not shown) provided in the stage 3 to secure the adsorption before being taken out. Also, the tray 20, which becomes empty after all of the chips 40 are mounted, is taken out of the processing chamber 1.

In accordance with the mounting method of the present embodiment, the number of operations of the mounting device can be minimized and the time required for mounting all chips on a substrate can be reduced, which will be described hereinafter.

In the mounting device in accordance with the present embodiment, the nozzle 6 is integrated with the adsorption head 5. The nozzle 6 is provided to eject water to the contact region 31-2 where the next chip 40-2 is to be mounted at a predetermined pitch P from the contact region 31-1 adjacent to the contact region 31-2, while the adsorption head 5 mounts the chip 40-1 in the contact region 31-1 where water has been coated. Thus, it is not necessary for the robot 4 to move the adsorption head 5 and the nozzle from the contact region 31-1 where the chip 40-1 is mounted to the adjacent contact region 31-2 where water is needed to be coated to mount the next chip 40-2.

For example, the time required for the robot 4 to move the adsorption head 5 together with the nozzle 6 from above the tray 20 to above the substrate 30 while the chip 40-1 is adsorbed and held to the adsorption head 5 which is the same as the time required for step S17, is set to 0.5 seconds. Further, the time required for the robot 4 to move the adsorption head 5 together with the nozzle 6 from the contact region 31-1 where the chip 40-1 is mounted by the adsorption head 5 to the adjacent contact region 31-2 where water is coated by the nozzle 6 to mount the next chip 40-2 after the chip 40-1 is mounted by the adsorption head 5, is set to 0.5 seconds. Also, the time required for the robot 4 to move the adsorption head 5 together with the nozzle 6 from above the substrate 30 to above the tray 20 after the chip 40-1 is mounted which is the same as the time required for step S14, is set to 0.5 seconds.

In accordance with the present embodiment, an operation of the robot 4 moving the adsorption head 5 together with the nozzle 6 from the contact region 31-1 to the adjacent contact region 31-2 can be omitted, and the time required for the operation can be saved. Thus, an operation of the robot 4 involved in mounting one chip 40 on the substrate 30 and the time required for the operation of the robot 4 can be reduced to ⅔ of the case including an operation of moving the adsorption head 5 together with the nozzle 6 from the contact region 31-1 to the adjacent contact region 31-2.

In accordance with the mounting method in accordance with the present embodiment, the chips are self-aligned to the substrate by a liquid, which will be described below with reference to FIGS. 8A to 10B.

FIGS. 8A to 8D are plan views and cross-sectional views showing how the state of a chip is changed from the state of being brought into contact with the surface of water while being obliquely misaligned with the regions to the state of being mounted in proper positions by self-alignment. FIGS. 8A to 8D show the change over time, wherein the upper section illustrates the plan views and the lower section illustrates the cross-sectional views.

Figure 10A:
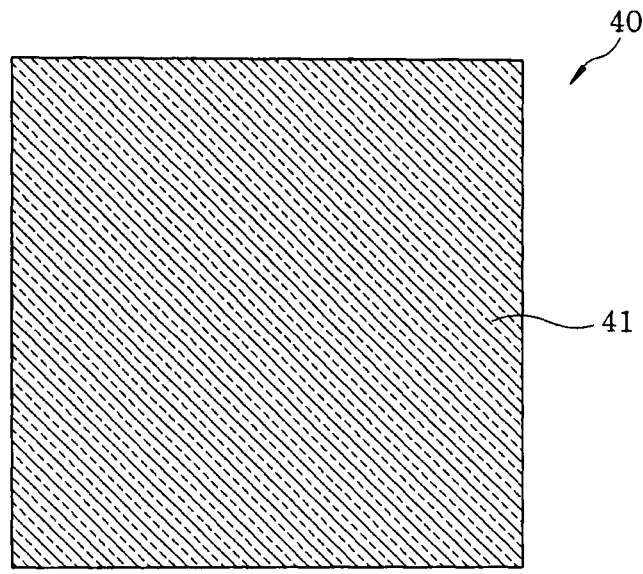
FIGS. 10A and 10B are plan views each illustrating a hydrophilized region of the surface of the chip.
Figure 10B:
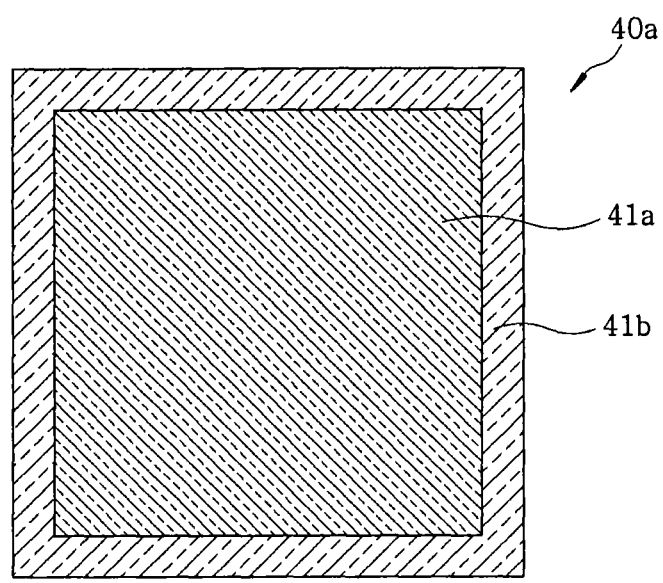

FIGS. 9A to 9D are plan views and cross-sectional views showing how the state of a chip is changed from the state of being brought into contact with the surface of water while being horizontally misaligned with the regions to the state of being mounted in proper positions by self-alignment. FIGS. 9A to 9D show the change over time, wherein the upper section illustrates the plan views of and the lower section illustrates the cross-sectional views. FIGS. 8A and 9D show merely a portion of the substrate 10 around the regions. FIGS. 10A and 10B are plan views illustrating the hydrophilized region of the surfaces of the chips.

In a state that the joint portions 41 of the chips 40 are brought into contact with the contact regions 31 of the substrate 30 while being obliquely misaligned therewith, water from the water layers 52 formed in the contact regions spreads to and wet the joint portions 41 that are subjected to the hydrophilization process, as shown in FIG. 8A. Then, with the surface tension of water, the chips 40 are rotated from FIG. 8B to FIG. 8C, narrowing the gap between the contact regions 31 and the joint portions 41 in such a way that the contact regions 31 and the joint portions 41, which are designed to have the same size, substantially entirely overlap with each other. Finally, the joint portions 41 of the chips 40 substantially entirely overlap with the contact regions 31 of the substrate 30, as shown in FIG. 8D.

Meanwhile, when the joint portions 41 of the chips 40 are brought into contact with the contact regions 31 of the substrate 30 while being horizontally misaligned therewith, water from the water layers 52 formed on the contact regions spreads to and wet the joint portions 41 that are subjected to the hydrophilization process, as shown in FIG. 9A. Then, with the surface tension of water, the chips 40 are moved horizontally from FIG. 9B to FIG. 9C, narrowing the gap between the joint portions 41 and the contact regions 31 in such a way that the joint portions 41 and the contact regions 31, which are designed to have the same size, substantially entirely overlap with each other. Finally, the joint portions 41 of the chips 40 substantially entirely overlap with the contact regions 31 of the substrate 30, as shown in FIG. 9D.

As shown in FIG. 10A, since the entire surface of each of the chips 40 is generally hydrophilized to form the joint portions 41, the surface of the edge region of the chips 40 is also hydrophilized. However, as shown in FIG. 10B, a chip 40a may have a center region defined as joint portions 41a and a non-hydrophilized edge region defined as hydrophobic portions (hydrophobic frame) 41b. By providing the hydrophobic frame 41b on the edge region of the chips 40a, the position alignment can be realized by using the shape of a boundary between the joint portions 41a and the hydrophobic frame 41b. Thus, even though the chips have an undesired shape of edge portions due to a burr involved in dicing the chips into individual pieces, if the shape of the joint portions 41a in the center region is maintained properly, the chips are aligned with chip mounting regions by water at high accuracy.

Although there is no particular limitation as to a method of forming the hydrophobic frame 41b, and the hydrophobic frame 41b may be formed such that the surfaces of the joint portions 41a are formed of, e.g., a $SiO_2$ film having hydrophilicity and the surface of the hydrophobic frame 41b is formed of, e.g., Si.

As described above, in accordance with the present embodiment, one chip is adsorbed and taken out by an adsorption head from a tray in which chips are accommodated and then is mounted in one contact region of the surface of a substrate where water has been coated. Further, while the chip is mounted in the contact region, water is coated by a nozzle on a contact region of the surface of the substrate where a next chip is to be mounted. Accordingly, the chips are self-aligned to the substrate. Thus, it is possible to reduce the time required for mounting all of the chips on the substrate with a minimal number of operations of a mounting device without having to precisely control the position of the adsorption head adsorbing the chips.

The present embodiment has been described with reference to the case where a chip mounting region of the surface of the substrate is hydrophilized. Alternatively, an uneven structure having a bank, a groove or the like, may be formed around the chip mounting region so that a liquid does not spread to the other region than the chip mounting region, and thus the chip mounting region may not be hydrophilized.

In the present embodiment, the adsorption head is returned together with the nozzle to above the tray in step S14 after step S13 in order to mount the first chip. However, as for the first chip, step S13 may be carried out between steps S17 and S18.

The present embodiment has been described with reference to the case where the adsorption head is moved together with the nozzle that is integrated therewith. As far as the adsorption head and the nozzle can be moved together, they may be separately moved in the same motions.

The present embodiment has been described with reference to the case where water is coated on a contact region of the surface of the substrate where a next chip is to be mounted while one chip is mounted in one contact region. However, water may be coated on any contact region different from one contact region while one chip is mounted in the contact region. For example, water may be coated on a contact region where a further next chip is mounted while one chip is mounted in the first contact region.

The present embodiment has been described with reference to the case where the adsorption head is moved together with the nozzle from above the tray to above the substrate. However, the adsorption head may be moved together with the nozzle from a tray side to a substrate side. For example, in the state that the tray and the substrate are erected vertically, the adsorption head is moved together with the nozzle from the tray side to the substrate side.

(Modification of Embodiment)

Figure 12A:
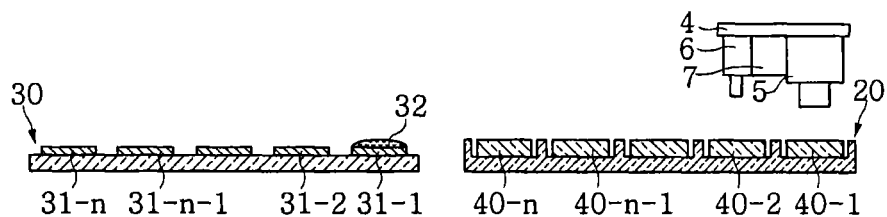
FIGS. 12A to 12G are schematic cross-sectional views illustrating the states of chips and a substrate in each process of the mounting method in accordance with the modification.
Figure 12B:
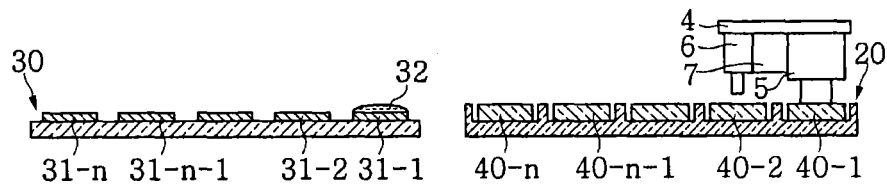
Figure 12C:
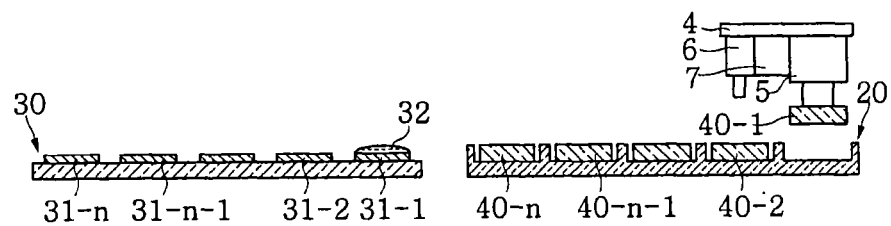
Figure 12D:
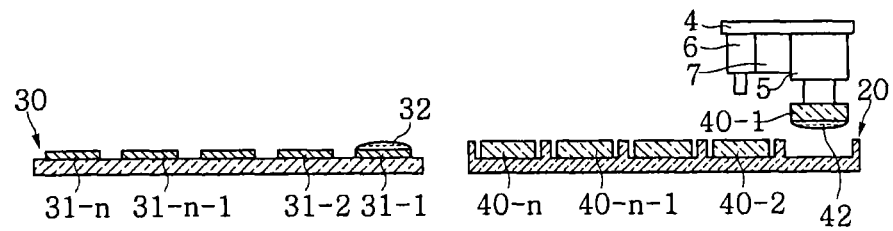
Figure 12E:
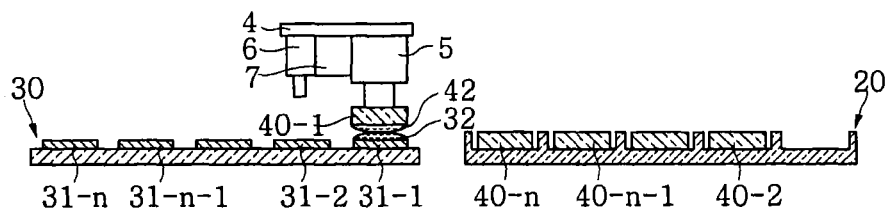
Figure 12F:
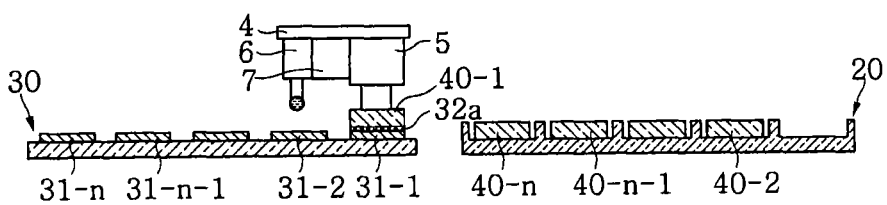
Figure 12G:
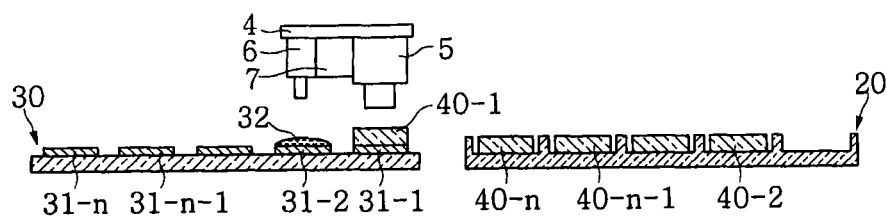

Next, a mounting method in accordance with a modification of the embodiment will be described with reference to FIGS. 11 to 12G.

FIG. 11 is a flowchart illustrating the processes of the mounting method in accordance with the modification. FIGS. 12A and 12G are schematic cross-sectional views illustrating the states of chips and a substrate in each process of the mounting method in accordance with the modification.

The mounting method in accordance with the modification is different from the mounting method in accordance with the embodiment in that water is coated on the surface of a chip hydrophilized.

The mounting method in accordance with the modification is carried out by the mounting device in accordance with the embodiment described with reference to FIG. 1. Here, the mounting device includes a chip nozzle serving to coat a liquid (not shown in FIG. 1) in the processing chamber. The chip nozzle is used to coat a liquid to a joint portion on the surface of the chip which comes in contact with water coated on a contact region on the substrate where the chip is to be mounted.

As shown in FIG. 11, the mounting method in accordance with the modification includes a loading process (step S31), a preliminary movement process (step S32), a preliminary coating process (step S33), a return process (step S34), an adsorption process (step S35), a take-out process (S36), an element coating process (S37), a movement process (step S38), a contact process (step S39), a coating process (step S40), and a release process (step S41).

A substrate and chips are prepared in advance in the same manner as in the embodiment.

First, steps S31 to S33 are carried out. Steps S31 to S33 are the same as steps S11 to S13. The states of the chips and the substrate in steps S31 and S32 are the same as shown in FIGS. 7AA and 7AB. Further, the state of the chips and the substrate in step S33 is the same as shown in FIGS. 7C1 and 7C2.

Next, steps S34 to S36 are carried out on a first chip 40-1. Steps S34 to S36 are the same as steps S14 to S16. FIGS. 12A to 12C show the states of the chips and the substrate in steps S34 to S36, which are the same as FIGS. 7D to 7F.

Next, the element coating process is carried out on the first chip 40-1 in step S37. In step S37, water is coated on the surface of the chip 40-1. FIG. 12D shows the state of the chip and the substrate in step S37. As shown in FIG. 12D, a water layer (water drop) 42 is coated on a joint portion 41 on the surface of the chip 40-1 which is to come in contact with a water layer 32 coated on a contact region 31-1 on the surface of a substrate 30 where the chip 40-1 is to be mounted.

For example, the adsorption head 5 is moved to above the chip nozzle provided in the processing chamber 1 by the robot 4 while the first chip 40-1 is adsorbed in the adsorption head 5, and water is ejected to the bottom surface of the first chip 40-1 adsorbed to the adsorption head 5 through the chip nozzle. As in the embodiment, the joint portion 41 on the surface of the chip 40 which is to come in contact with the water layer 32 coated on the contact region 31 is hydrophilized in advance. Thus, the water ejected through the chip nozzle spreads to the joint portion 41, as shown in FIG. 12D.

Next, the movement process is carried out on the first chip 40-1 in step S38. Step S38 is the same as step S17. The state of the chips and the substrate in step S38 is shown in FIG. 12E.

Next, the contact process in step S39 and the coating process in step S40 are carried out at the same time. In step S39, the adsorption head 5 is brought close to the substrate 30 so that the water layer 42 coated on the first chip 40-1 comes in contact with the water layer 32 coated on the contact region 31-1. In step S40, water is coated to mount a next chip 40-2. FIG. 12F shows the state of the chips and the substrate in steps S39 and S40.

By the robot 4, the adsorption head 5, together with the nozzle 6, is moved to above the contact region 31-1 and then continuously moved down close to the substrate, about to the mounting contact region 31-1 on the substrate 30, so that the water layer 42 coated on the surface of the first chip 40-1 comes in contact with the water layer 32 coated on the contact region 31-1, as shown in FIG. 12F.

While the water layer 42 on the first chip 40-1 adsorbed to the adsorption head 5 comes in contact with the water layer 32 coated on the contact region 31-1, water is ejected through the nozzle 6 to a contact region 31-2 where a next chip 40-2 is to be mounted, the contact region 31-2 being adjacent to the contact region 31-1.

Next, the release process is carried out in step S41. Step S41 is the same as step S20. The state of the chips and the substrate in step S41 is shown in FIG. 12G.

Through the respective processes shown in FIGS. 12A to 12G, the first chip 40-1 is mounted by the adsorption head 5 from the tray 20 to the first contact region 31-1. Also, while the first chip 40-1 is mounted in the first contact region 31-1 by the adsorption head 5, another water layer 32 is coated by the nozzle 6 to the contact region 31-2 adjacent to the first contact region 31-1 in order to mount the second chip 40-2 thereon.

Subsequently, steps S34 to S41 are repeated to mount the second chip 40-2 to a $(n-1)^{th}$ chip 40-n-1, and steps S34 to S41, except for step S40, are carried out to mount an $n^{th}$ chip 40-n, thereby sequentially mounting the first chip 40-1 to the final chip ($n^{th}$ chip) 40-n at a predetermined pitch P in one row. Then, a series of such processes is repeated a plurality of times (m times), thereby sequentially mounting the chips 40 on the substrate 30 to be arranged at the predetermined pitch P horizontally in an m×n matrix form.

In accordance with the modification, one chip is adsorbed and taken out by an adsorption head from a tray in which chips are amounted and then is mounted in one contact region of the surface of a substrate where water has been coated. Further, while mounting the chip in the contact region, water is coated by a nozzle on a contact region of the surface of the substrate where a next chip is to be mounted. Accordingly, the chips are self-aligned to the substrate. Thus, it is possible to reduce the time required for mounting all of the chips on the substrate with a minimal number of operations of a mounting device without having to precisely control the position of the adsorption head adsorbing the chips.

In the modification, water is also coated on the surface of a chip adsorbed to the adsorption head. Accordingly, the chip is more securely self-aligned with the substrate.

While the invention has been shown and described with respect to the embodiments, it will be understood by those skilled in the art that various changes and modifications may be made without departing from the scope of the invention as defined in the following claims.

This International application claims priority to Japanese Patent Application No. 2009-297626 filed on Dec. 28, 2009, the entire contents of which are incorporated herein by reference.

What is claimed is:

1. A mounting method of sequentially mounting elements on a substrate, the mounting method comprising:
   a mounting process of mounting one element, which is taken out by a take-out part from an accommodating part in which the elements are accommodated, on a first contact region of the surface of the substrate where a liquid is coated; and
   a coating process of coating a liquid, by a coating part movably provided together with the take-out part, on a contact region of the surface of the substrate different from the first contact region when the one element is mounted on the first region.

2. The mounting method of claim 1, wherein, in the coating process, the liquid is coated on a second contact region where a subsequent element to the one element is to be mounted.

3. The mounting method of claim 1, wherein the take-out part is an adsorbing part which adsorbs and takes out the one element, and,
   in the mounting process, the adsorbing part adsorbing the one element is brought close to the substrate so that the one element comes in contact with the liquid coated on the first contact region and the adsorbing part releases the adsorption when the element comes in contact with the liquid.

4. The mounting method of claim 1, further comprising:
a movement process of moving the take-out part taking out the one element and the coating part together from the mounting part side to the substrate side.

5. The mounting method of claim 1, wherein the first contact region and the second contact region different from the first contact region are hydrophilized.

6. The mounting method of claim 1, wherein a joint portion on the surface of the one element which is to come in contact with the liquid coated on the first contact region is hydrophilized.

7. The mounting method of claim 1, wherein the element and the substrate are aligned by the liquid coated on the first contact region in the mounting process.

8. The mounting method of claim 1, further comprising:
an element coating process of coating a liquid on a joint portion on the surface of the element which is to come in contact with the liquid coated on the first contact region.

9. The mounting method of claim 1, wherein the elements are mounted on the substrate at a predetermined pitch, and
the coating part is provided such that the interval between the coating part and the take-out part is variable depending on the predetermined pitch.

10. A mounting device for sequentially mounting elements on a substrate, the mounting device comprising:
an accommodating part for accommodating the elements;
a substrate supporting unit for supporting the substrate;
a take-out part for taking out one element accommodated in the accommodating part and mounting the one element in a first contact region of the surface of the substrate where a liquid has been coated;
a coating part, movably provided together with the take-out part, for coating a liquid on a second contact region of the surface of the substrate different from the first contact region while the first element is mounted in the first contact region; and
a movement part for moving the take-out part taking out the one element and the coating part together from the mounting part side to the substrate side.

11. The mounting device of claim 10, wherein the coating part coats the liquid on the second contact region where a subsequent element to the one element is to be mounted when the one element is mounted in the first contact region.

12. The mounting device of claim 10, wherein the take-out part is an adsorbing part which adsorbs and takes out the element,
the moving part brings the adsorbing part adsorbing the one element close to the substrate so that the one element comes in contact with the liquid coated on the first contact region, and
the adsorbing part releases the adsorption when the one element comes in contact with the liquid coated on the first contact region.

13. The mounting device of claim 10, wherein the first contact region and the second contact region different from the first contact region are hydrophilized.

14. The mounting device of claim 10, wherein a joint portion on the surface of the element which is to come in contact with the liquid coated on the first contact region is hydrophilized.

15. The mounting device of claim 10, wherein the one element and the substrate are aligned by the liquid coated on the first contact region.

16. The mounting device of claim 10, wherein the elements are mounted on the substrate at a predetermined pitch, and
the coating part is provided such that the interval between the coating part and the take-out part is variable depending on the predetermined pitch.

* * * * *